United States Patent
Mankos et al.

(10) Patent No.: US 6,903,338 B2
(45) Date of Patent: Jun. 7, 2005

(54) METHOD AND APPARATUS FOR REDUCING SUBSTRATE EDGE EFFECTS IN ELECTRON LENSES

(75) Inventors: Marian Mankos, San Francisco, CA (US); David L. Adler, San Jose, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 98 days.

(21) Appl. No.: 10/600,050

(22) Filed: Jun. 20, 2003

(65) Prior Publication Data

US 2004/0149906 A1 Aug. 5, 2004

Related U.S. Application Data

(60) Provisional application No. 60/443,666, filed on Jan. 30, 2003.

(51) Int. Cl.[7] .................................................. G21K 7/00
(52) U.S. Cl. ....................... 250/310; 250/311; 428/620; 324/751; 324/750
(58) Field of Search ................................ 250/310, 311; 428/620; 324/751, 750

(56) References Cited

U.S. PATENT DOCUMENTS 4,877,326 A   10/1989  Chadwick et al.
5,973,323 A   10/1999  Adler et al.
6,566,897 B2 *  5/2003  Lo et al. ...................... 324/751
6,710,342 B1 *  3/2004  Jau et al. ..................... 250/311

OTHER PUBLICATIONS

Suzuki et al., "Workpiece Holder, Semiconductor Fabricating Apparatus, Semiconductor Inspection Apparatus . . . ", Pub. No.: US 2003/0155508 A1, pub. date: Aug. 21, 2003.*

* cited by examiner

*Primary Examiner*—John R. Lee
*Assistant Examiner*—Zia R. Hashmi
(74) *Attorney, Agent, or Firm*—Okamoto & Benedicto LLP

(57) ABSTRACT

One embodiment disclosed pertains to a method for inspecting a substrate. The method includes inserting the substrate into a holding place of a substrate holder, moving the substrate holder under an electron beam, and applying a voltage to a conductive element of the substrate holder. The voltage applied to the conductive element reduces a substrate edge effect. Another embodiment disclosed relates to an apparatus for holding a substrate that reduces a substrate edge effect. The apparatus includes a holding place for insertion of the substrate and a conductive element. The conductive element is positioned so as to be located within a gap between an edge of the holding place and an edge of the substrate.

18 Claims, 11 Drawing Sheets

METHOD AND APPARATUS FOR REDUCING SUBSTRATE EDGE EFFECTS IN ELECTRON LENSES

CROSS-REFERENCE TO RELATED APPLICATIONS

The present application claims the benefit of provisional patent application No. 60/443,666, filed Jan. 30, 2003, entitled "Method and Apparatus for Reducing Substrate Edge Effects in Electron Lenses", by inventors Marian Mankos and David L. Adler, the disclosure of which is hereby incorporated by reference.

BACKGROUND OF THE INVENTION

1. Field of the Invention

The present invention relates generally to electron beam (e-beam) methods and apparatus. The present invention relates more particularly to automated e-beam inspection systems for semiconductor manufacturing.

2. Description of the Background Art

A variety of methods have been used to examine microscopic surface structures of semiconductors. These have important applications in the field of semiconductor integrated circuit (IC) fabrication, where microscopic defects at a surface layer can make the difference between a properly functioning or non-functioning IC. For example, holes or vias in an intermediate insulating layer often provide a physical conduit for an electrical connection between two outer conducting layers. If one of these holes or vias becomes clogged with non-conductive material, this electrical connection between layers will not be established. Automated inspection of the semiconductors is used to ensure a level of quality control in the manufacture of the integrated circuits.

SUMMARY

One embodiment of the invention pertains to a method for inspecting a substrate. The method includes inserting the substrate into a holding place of a substrate holder, moving the substrate holder under an electron beam, and applying a voltage to a conductive element of the substrate holder. The voltage applied to the conductive element reduces a substrate edge effect.

Another embodiment of the invention relates to an apparatus for holding a substrate that reduces a substrate edge effect. The apparatus includes a holding place for insertion of the substrate and a conductive element. The conductive element is positioned so as to be located within a gap between an edge of the holding place and an edge of the substrate.

Another embodiment of the invention pertains to a system for inspecting semiconductor wafers. The system includes a mechanism for moving a wafer holder under an electron beam, and means for reducing a so-called wafer edge effect. The wafer edge effect depends upon a size of a gap between an edge of the wafer and an edge of the wafer holder.

DETAILED DESCRIPTION

In accordance with one embodiment of the invention, an automated inspection system continuously moves semiconductor wafers under an electron beam. One such system is described, for example, in U.S. Pat. No. 5,973,323, entitled "Apparatus and Method for Secondary Electron Emission Microscope," inventors Adler et al., and assigned at issuance to KLA-Tencor Corporation of San Jose, Calif. U.S. Pat. No. 5,973,323 is hereby incorporated by reference in its entirety.

One type of conventional electron inspection system utilizes a combined electrostatic/magnetic cathode objective lens with a strong uniform electric field (few kilovolts per millimeter). Image obtained using such a system has distortions near the edge of a semiconductor wafer being inspected, and the distortion is problematic and disadvantageous.

The present invention identifies a significant source of that distortion as the gap between the wafer edge and the wafer holder. Applicants have determined that this gap produces non-uniformity or distortion in the electrostatic field near the edge of the wafer. The distorted electrostatic field near the edge of the wafer changes the paths of electrons near the edge and so results in the image distortion.

Figure 1A:
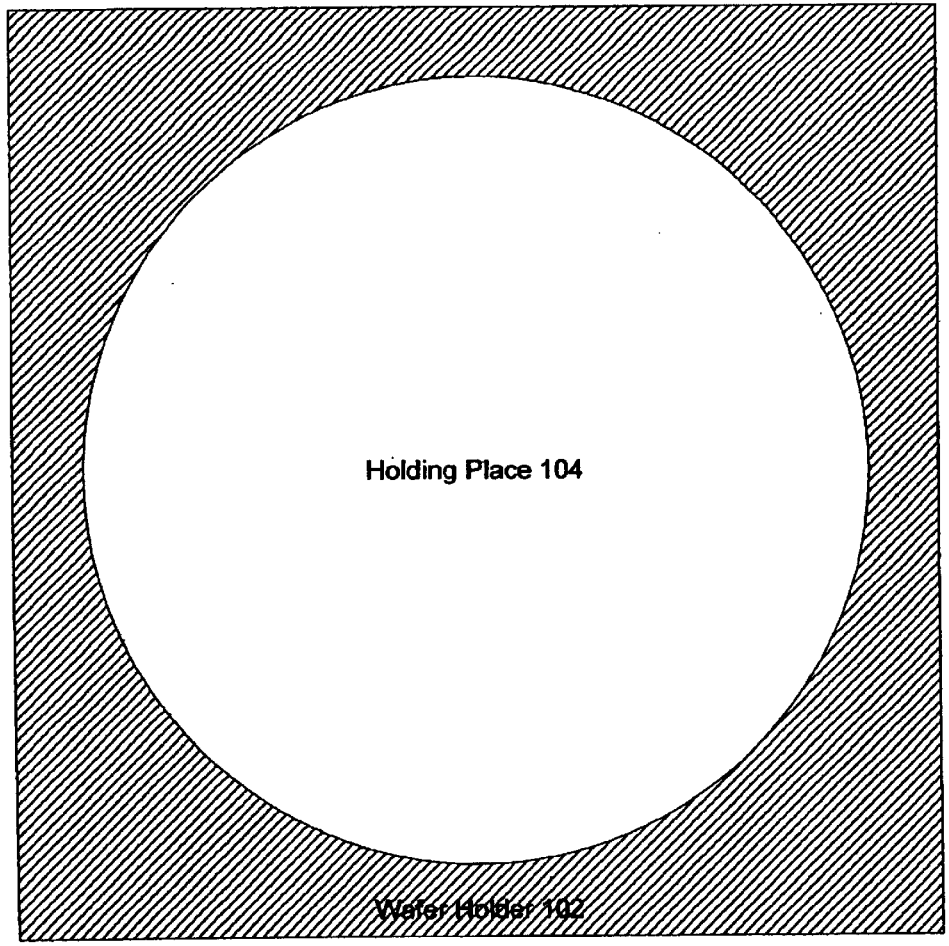
FIG. 1A is a top view depiction of a conventional wafer holder before wafer insertion.

FIG. 1A is a top view depiction of a conventional wafer holder 102 before wafer insertion. The conventional wafer holder 102 includes a holding place 104 into which a wafer 106 may be inserted. The holding place 104 is designed with a tolerance so as to be slightly larger than a wafer 106 to be able to fit the wafer 106 therein.

Figure 1B:
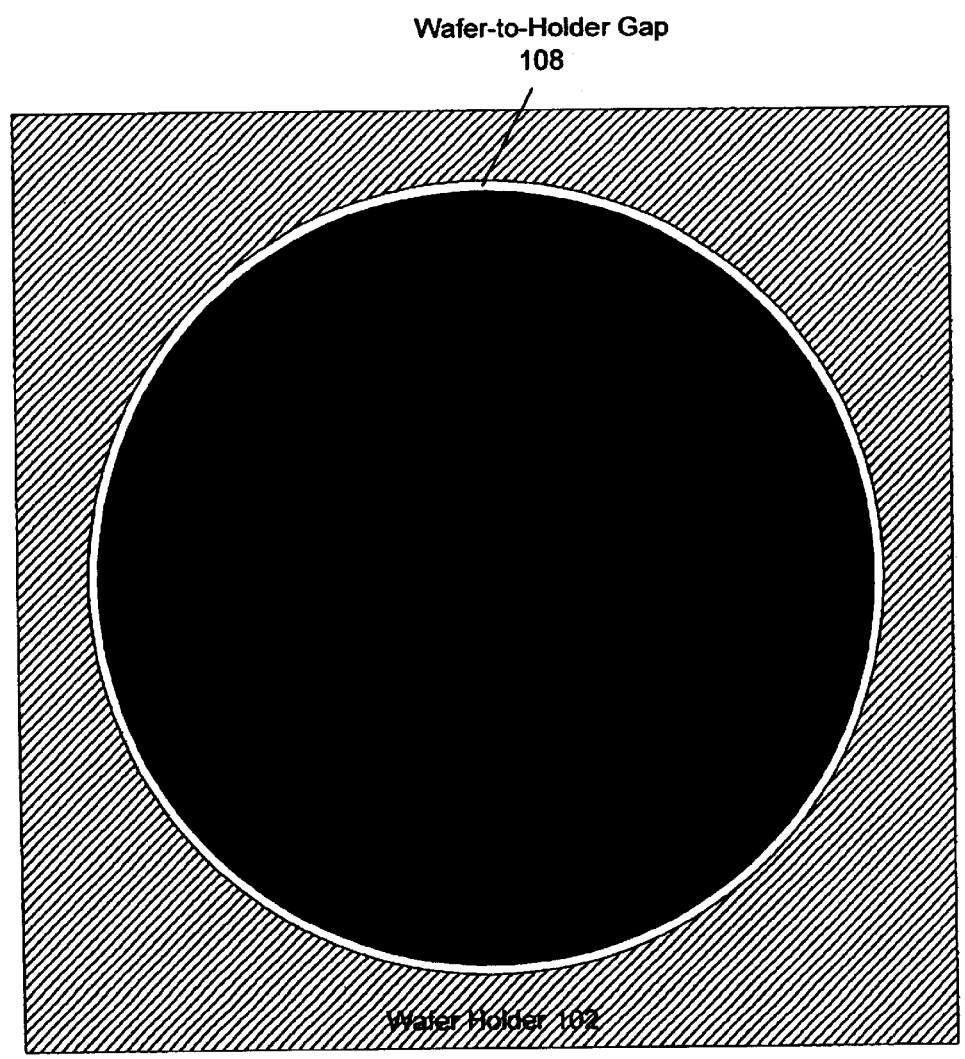
FIG. 1B is a top view depiction of a conventional wafer holder after wafer insertion.
Figure 1C:
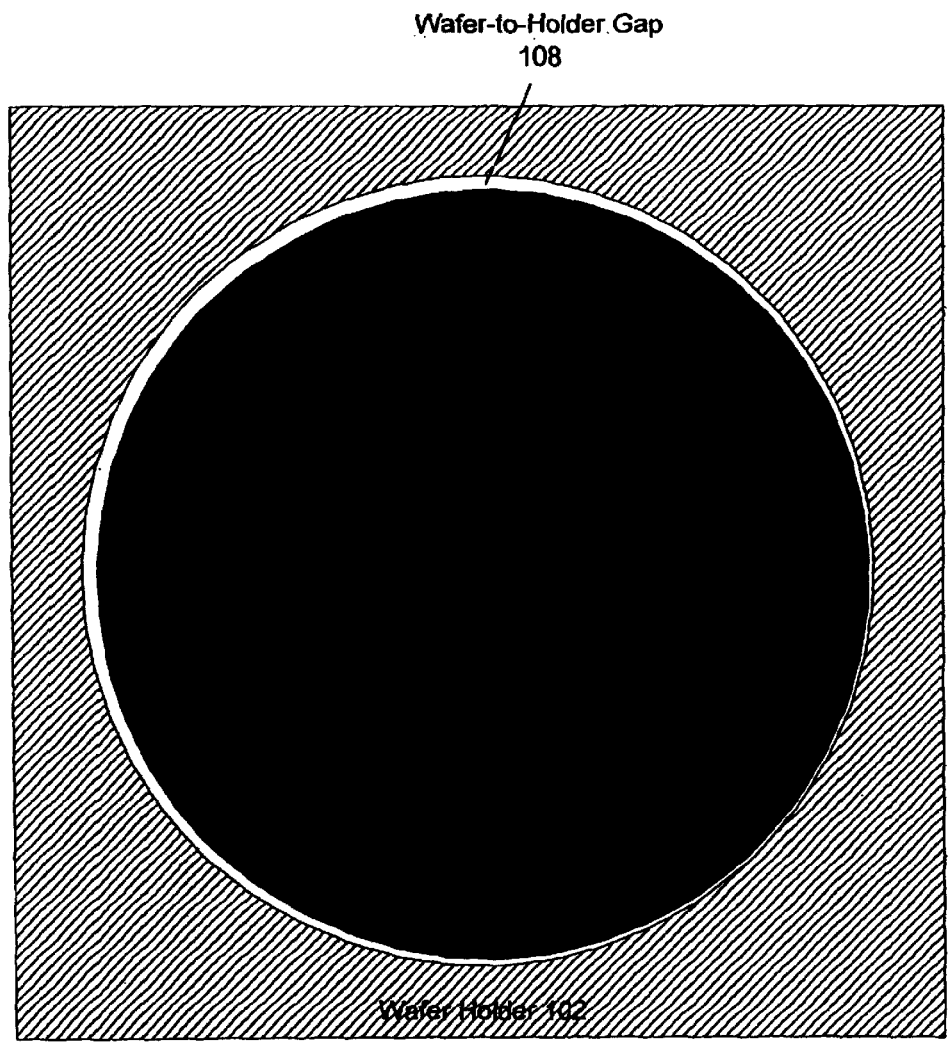
FIG. 1C is a top view depiction of a conventional wafer holder after wafer insertion where the wafer is not centered in the holding place.

FIG. 1B is a top view depiction of a conventional wafer holder 102 after wafer insertion. The wafer 106 is shown inserted into the holding place 104 of FIG. 1A. Since the holding place 104 is slightly larger than the wafer 106, a wafer-to-holder gap 108 is present after wafer insertion.. The wafer-to-holder gap 108 is shown as being uniform in FIG. 1B, but the wafer-to-holder gap 108 is likely to be non-uniform in practice. This is because the wafer 106 is typically not inserted into the exact center of the holding place 104. FIG. 1C is a top view depiction of a conventional wafer holder after wafer insertion where the wafer is not centered in the holding place. The wafer-to-holder gap 108 in this case is shown to be non-uniform around the circumference of the wafer 106.

Figure 2:
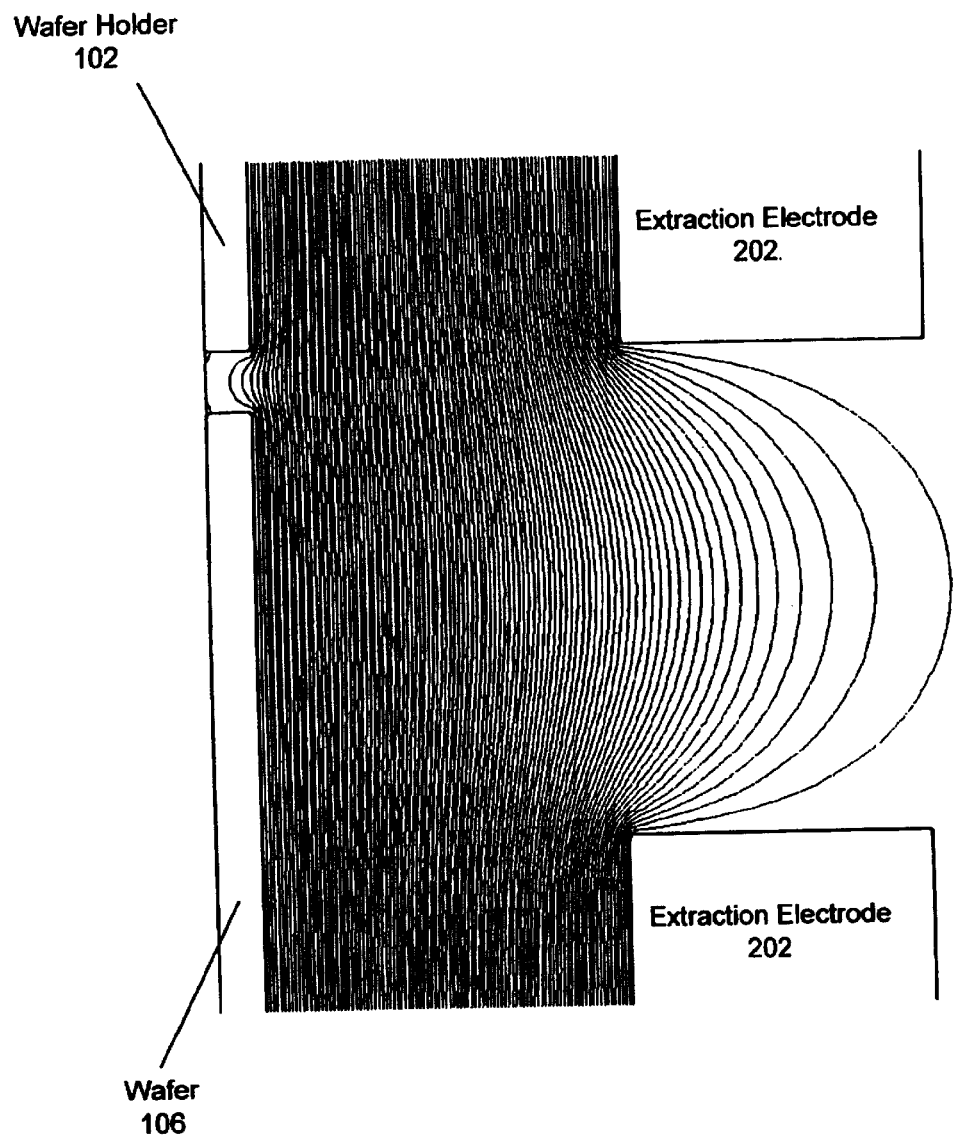
FIG. 2 is a cross-sectional diagram showing calculated electrostatic equipotential lines when a wafer edge in a conventional holder with a wafer is located near the center of an extraction electrode.

FIG. 2 is a cross-sectional diagram showing calculated electrostatic equipotential lines when a wafer edge in a conventional holder 102 with a wafer 106 is located near an extraction electrode 202. The extraction electrode 202 is part of the electron beam column. In effect, the extraction electrode 202 slows incident electrons before they impinge upon the wafer 106 and accelerates scattered electrons leaving the wafer 106 and traveling back up the column. The electrostatic field lines illustrated in FIG. 2 are primarily generated by the voltage difference applied between the extraction electrode 202 and the wafer holder 102. However, as illustrated, the gap between the wafer holder 102 and the wafer 106 inserted therein causes a distortion or perturbation in the electrostatic field near the edge of the wafer. As mentioned above, this distortion changes the paths of electrons near the edge of the wafer and so results in undesirable image distortion near the edge.

Figure 3A:
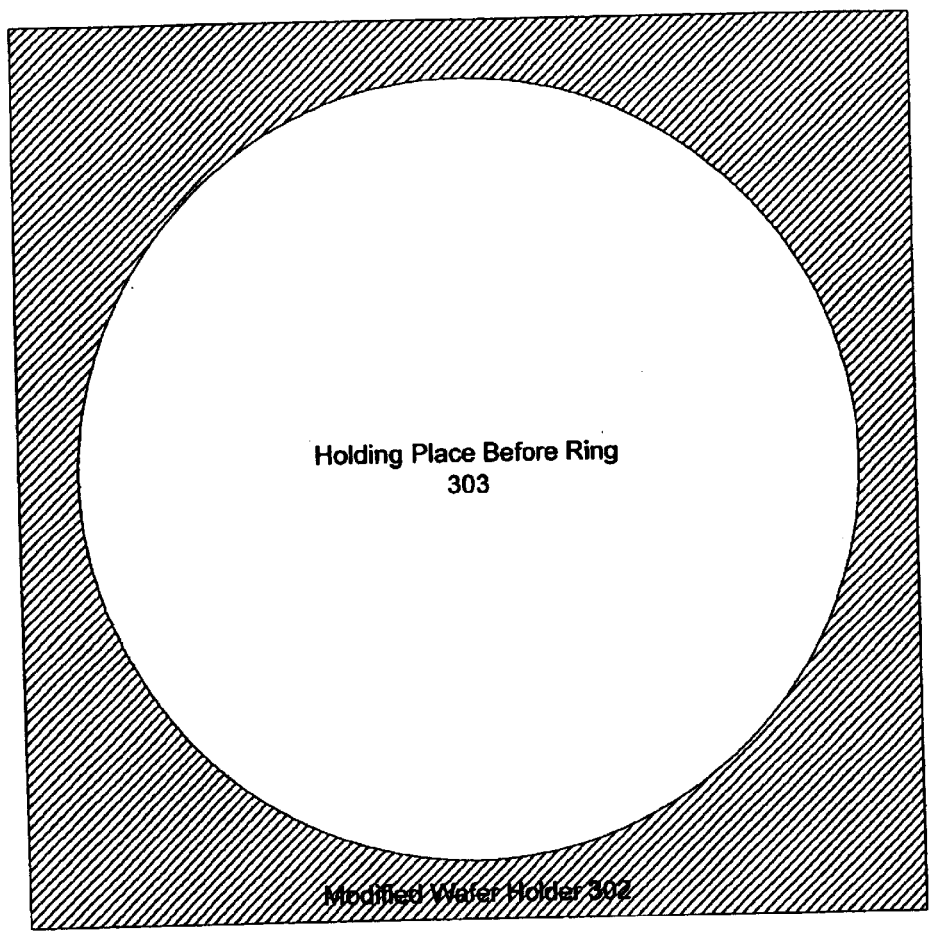
FIG. 3A is a top view depiction of a modified wafer holder prior to incorporation of a ring in accordance with an embodiment of the invention.

FIG. 3A is a top view depiction of a modified wafer holder 302 prior to incorporation of a ring 304 in accordance with an embodiment of the invention. The holding place before ring 303 is created such that it is slightly larger than the holding place 104 in the conventional holder 102; this is to make room for the ring 304 to be incorporated therein.

Figure 3B:
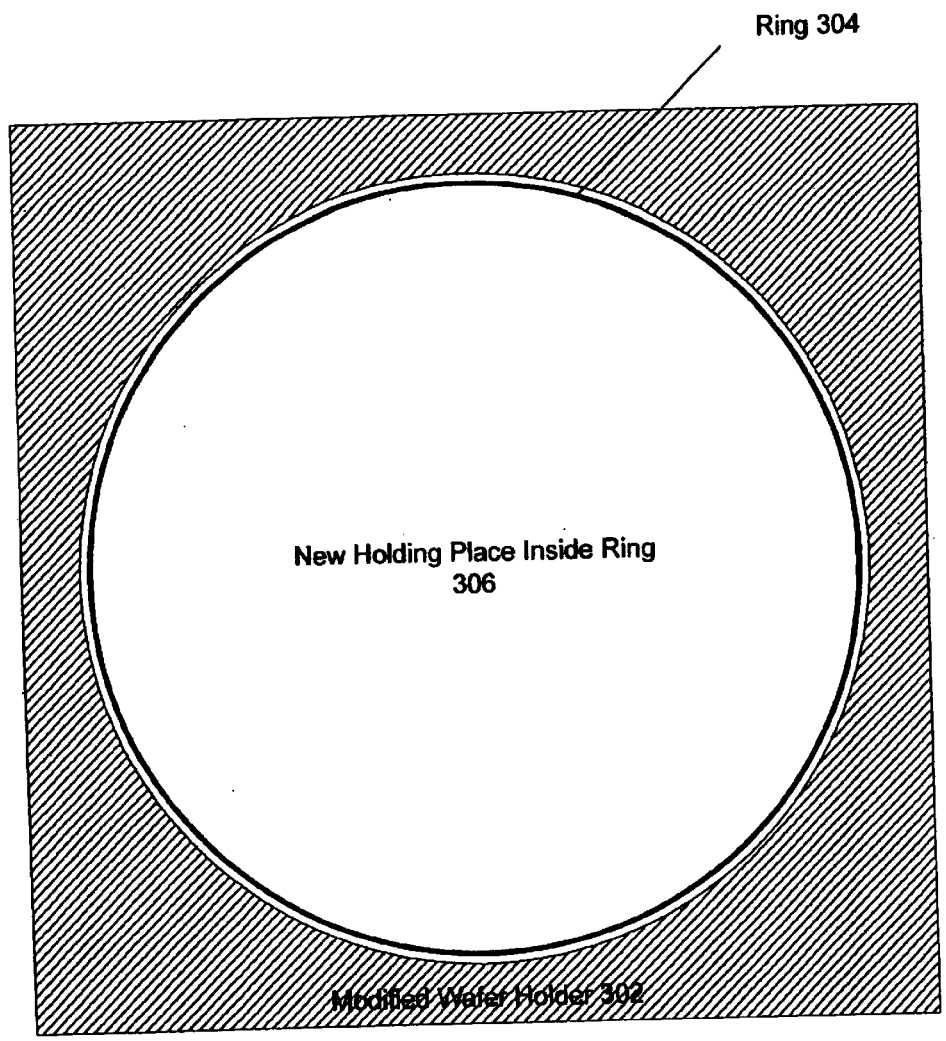
FIG. 3B is a top view depiction of a modified wafer holder with ring before wafer insertion in accordance with an embodiment of the invention.

FIG. 3B is a top view depiction of a modified wafer holder 302 with ring 304 before wafer insertion in accordance with an embodiment of the invention. The wafer holder 302 includes a ring 304. The ring 304 is a conductive ring that may hold an electric voltage that is different from the voltage of the modified holder 302 in general. In the modified holder 302, the ring 304 circumscribes a new holding place 306 into which a wafer 106 is to be inserted. In other words, the new holding place 306 is inside the ring 304. The new holding place 306 of the modified holder 302 should be of the same size as the holding place 104 of a corresponding conventional holder 102 such that standard sized wafers 106 may fit therein. In other words, the new holding place 306 designed with a tolerance so as to be slightly larger than a wafer 106 to be able to fit the wafer 106 therein.

Figure 3C:
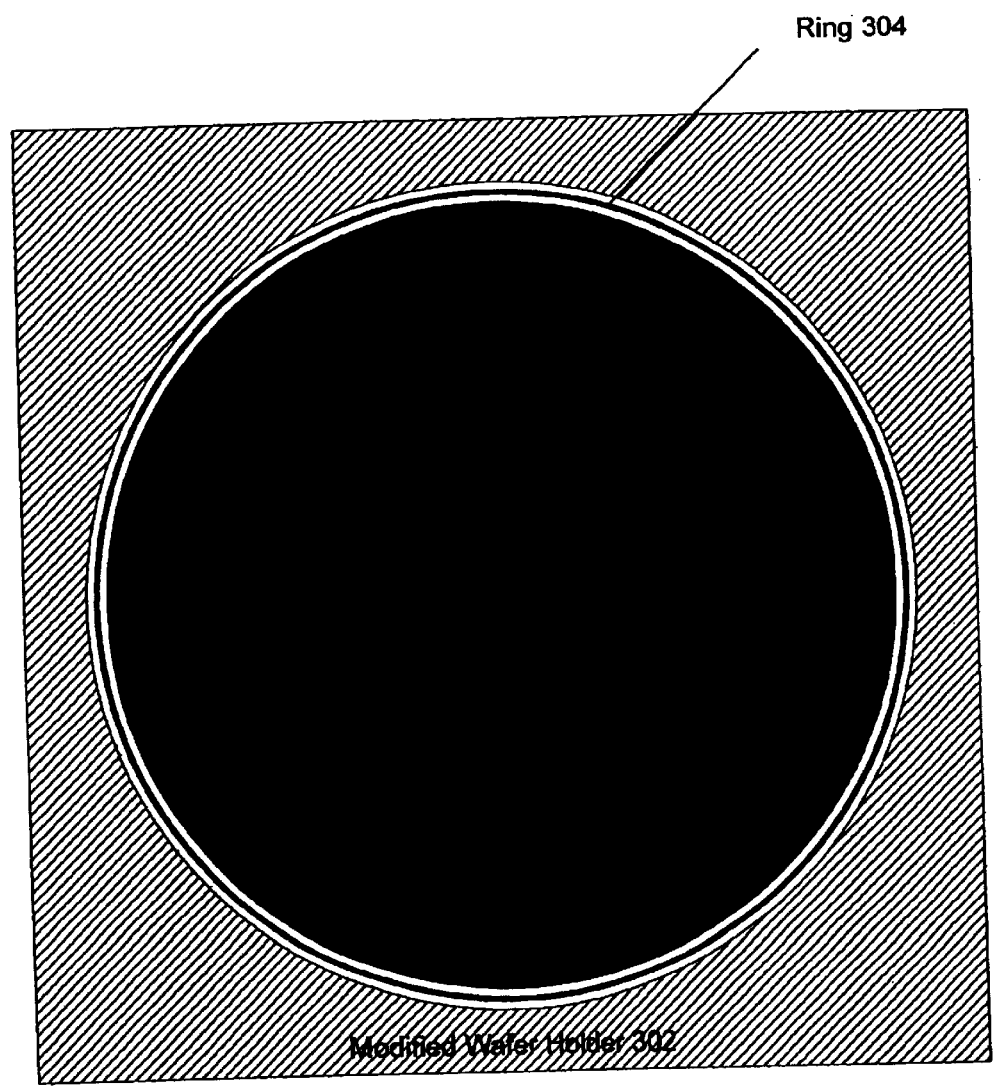
FIG. 3C is a top view depiction of a modified wafer holder with ring after wafer insertion in accordance with an embodiment of the invention.

FIG. 3C is a top view depiction of a modified wafer holder 302 with ring 304 after wafer insertion in accordance with an embodiment of the invention. The wafer 106 is shown inserted into the new holding place 306 of FIG. 3B. The gap between the wafer 106 and the wafer holder 302 (the wafer-to-holder gap) now includes the ring 304. While the wafer-to-holder gap is shown as being uniform, in FIG. 3C, it is likely to be non-uniform in practice. This is because the wafer 106 is typically not inserted into the exact center of the new holding place 306. As described further below, the ring 304 may be used advantageously to reduce wafer edge effects during e-beam inspection in accordance with an embodiment of the invention.

Figure 4:
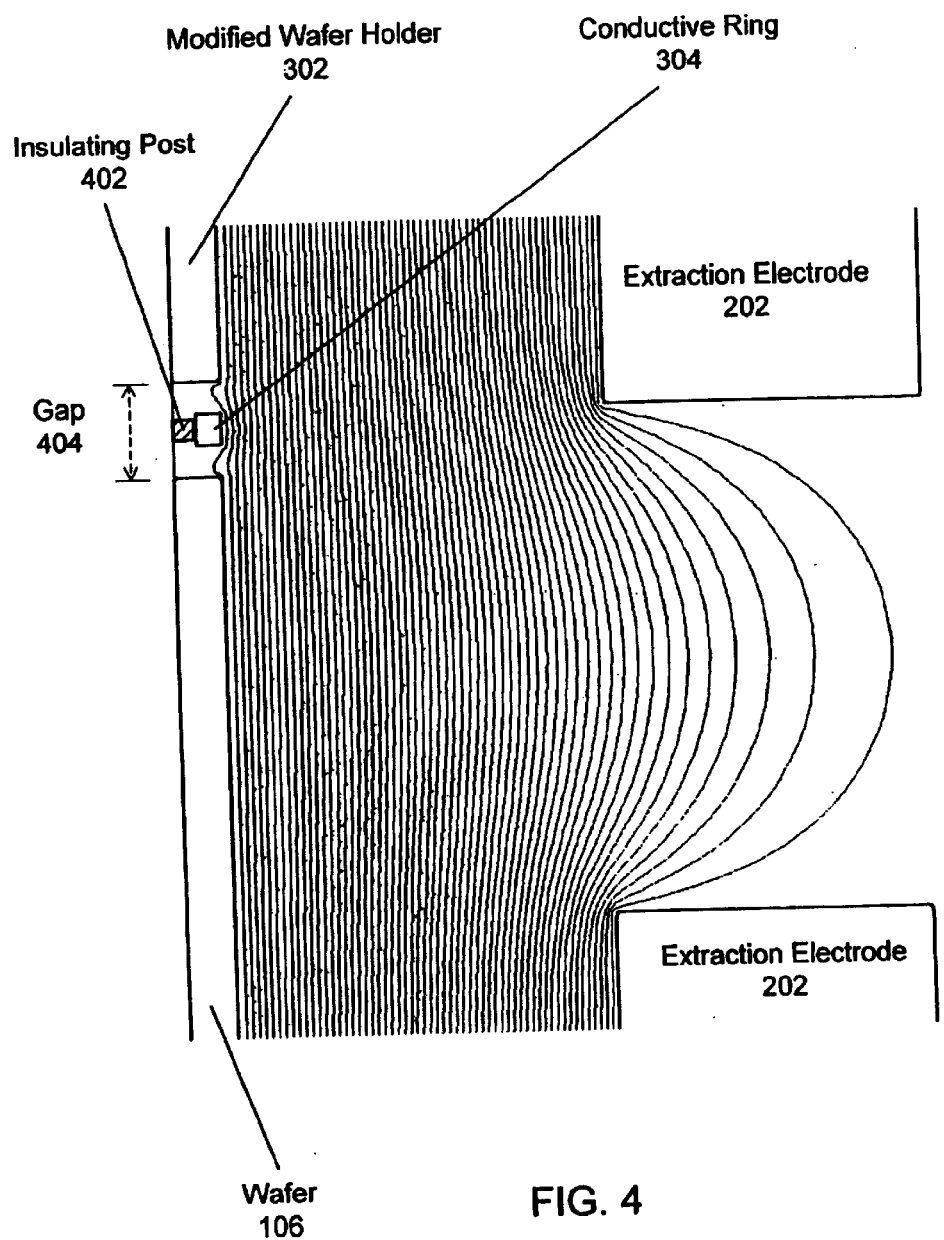
FIG. 4 is a cross-sectional diagram showing calculated electrostatic equipotential lines when a wafer edge in a modified holder is located near the center of an extraction electrode in accordance with an embodiment of the invention.

FIG. 4 is a cross-sectional diagram showing calculated electrostatic equipotential lines when a wafer edge in a modified holder 302 is located near an extraction electrode 202 in accordance with an embodiment of the invention. The cross section shows the modified holder 302 configured with the conductive ring 304 within the gap 404 between the edge of the wafer 106 and the edge of the holding place before ring 303. In other words, the wafer 106 is within the ring 303 of the holder 302.

In one embodiment, the conductive ring 304 may be supported by an insulating ring or a plurality of insulating posts 402. The support 402 locate the ring above the base or main portion of the holder and electrically isolate the ring from the base. Preferably, the posts 402 position the top of the ring 304 to be even with the top surfaces of the wafer 106 and holder 302. Preferably, three or four or more posts are used with the posts spaced far enough apart for stable support of the ring. Alternatively, instead of posts, other structures may be used to support and electronically isolate the ring above the base of the holder.

A voltage difference may be applied to the ring 304 with respect to the base of the holder to advantageously reduce the distortion of the electrostatic field over the wafer edge. Since the base of the holder is in electrical contact with the wafer 106, this creates a voltage difference between the ring 304 and the wafer 106. The voltage bias applied to the ring 304 may be applied, for example, with a conductive wire (not shown in FIG. 4) that is electrically isolated from the base of the holder. In one embodiment, the wire may be incorporated within, or attached to, the post 402. Alternatively, the wire may be separate from the post 402. The wire or other conductive mechanism couples the ring 304 to a variable power supply.

For example, in one particular case, a voltage difference of −440 volts (where the ring 304 is at a lower voltage than the wafer, and where the wafer is biased at −30 kilovolts) is used to substantially reduce the distortion so as to effectively even out the electrostatic field near the wafer edge. Calculated electrostatic field lines for such a case are shown in FIG. 4. The field lines in FIG. 4 are shown to be advantageously more uniform out to the edge of the wafer in comparison to the conventional field lines in FIG. 2.

The actual voltage difference to minimize the distortion near the wafer edge will depend upon the size of the wafer-to-holder gap 404 and also on features and parameters of the particular e-beam system that is being utilized. Because the wafer 106 may not be placed in the center of the holding place 306, the size of the gap 404 may vary at different points around the circumference of the wafer 106. Hence, the voltage difference for minimizing the distortion will vary at different points around the wafer edge.

Figure 5:
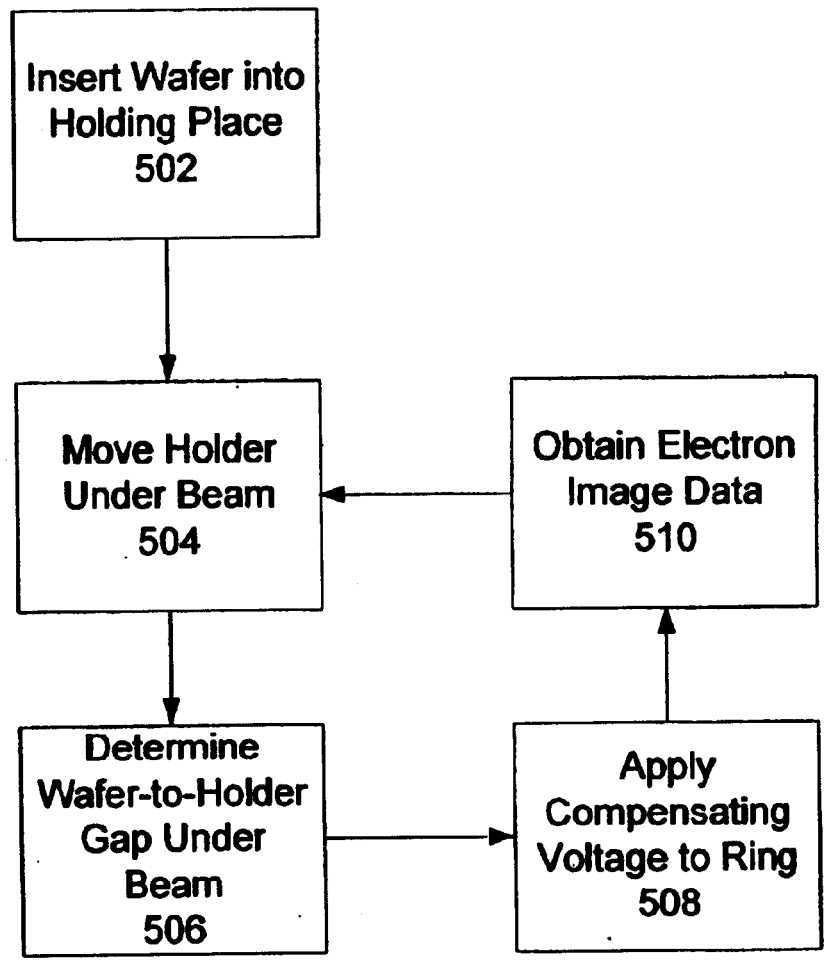
FIG. 5 is a flow chart depicting a method that reduces a wafer edge effect in accordance with an embodiment of the invention.

FIG. 5 is a flow chart depicting a method that reduces a wafer edge effect in accordance with an embodiment of the invention. A wafer 106 is inserted 502 into the holding place 306 within the ring 304. Subsequently, perhaps with several intervening process steps, the wafer holder 302 with wafer 106 is moved 504 under the e-beam. Of course, when the wafer is under the e-beam for inspection is the time period during which the reduction in edge effect is advantageous to achieve.

In accordance with an embodiment of the invention, the e-beam illuminates only a portion of the wafer 106 at a time. As such, only a section of the wafer edge is illuminated at one time. Each section of wafer edge has a corresponding wafer-to-holder gap 404 that may vary from edge section to edge section. Hence, a determination 506 may be made of the wafer-to-holder gap 404 of the edge section currently under the beam. For example, the gap 404 may be measured optically prior to illumination by the e-beam, or the gap 404 may be measured by a preliminary analysis of the electron image. Other means may also be used to measure the gap 404. Alternatively, as discussed below in relation to FIGS. 6 and 7, the gap 404 of the wafer 106 may be preset to be a predetermined function of the location on the circumference. Using the determined size of the gap 404 under the e-beam, a compensating voltage is determined and applied 508 to the ring 304. In accordance with a specific embodiment of the invention, the compensating voltage applied may be proportional to the local gap width. With the compensating voltage applied, the electron image data may be obtained 510 without the adverse edge effects due to the distortion in electrostatic field.

Figure 6:
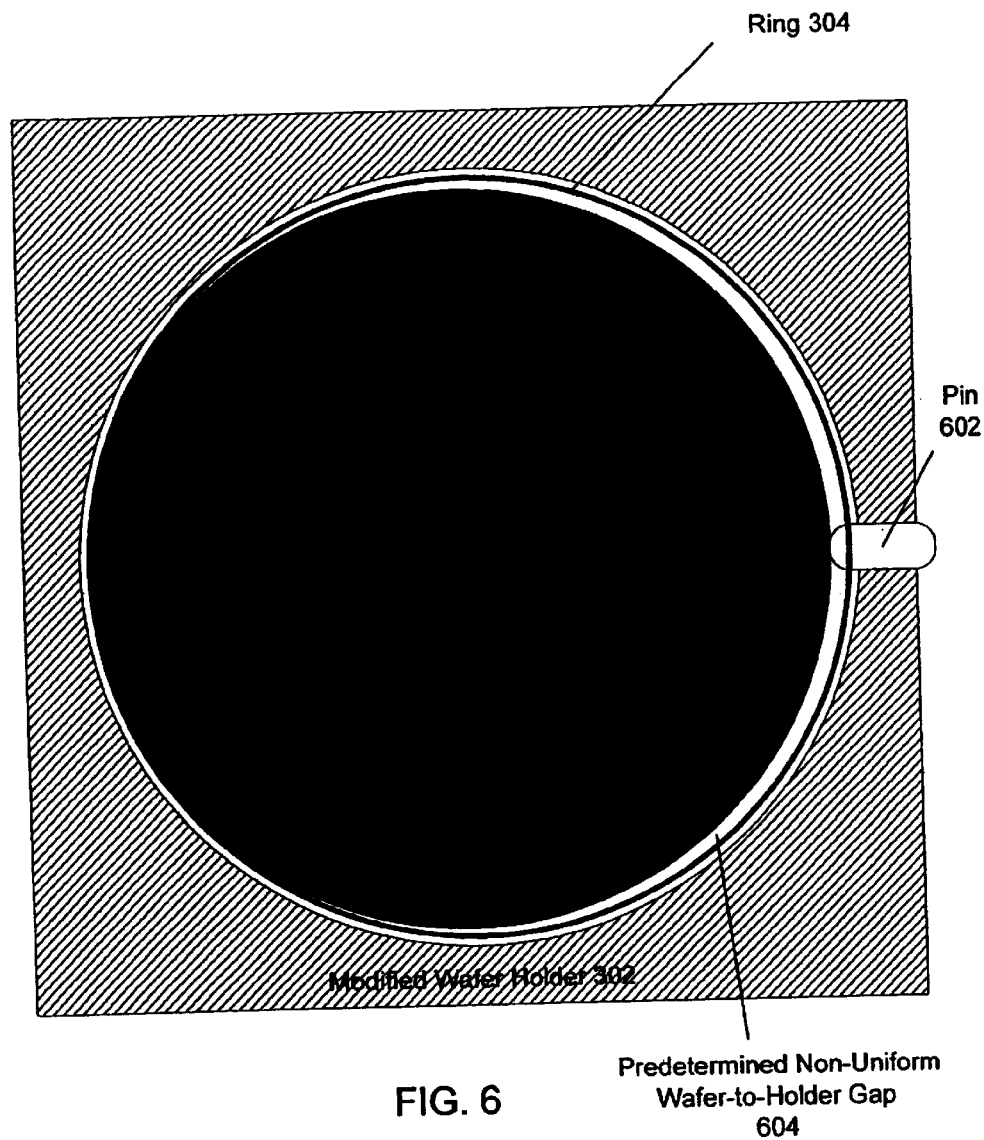
FIG. 6 is a top view depiction of another modified wafer holder in accordance with an embodiment of the invention.

FIG. 6 is a top view depiction of another modified wafer holder 302 in accordance with an embodiment of the invention. The holder 302 in this case uses a mechanism to achieve a predetermined wafer-to-holder gap 604. In the example depicted, the mechanism used is a movable pin 602. The pin 602 may be non-conductive or may be electrically isolated from the ring 304 and preferably fits under the ring 304. As discussed further below in relation to FIG. 7, after the wafer 106 is placed in the holder 302, the pin is actuated so as to move the wafer into a predetermined position within the holder 302. This results in the size of the wafer-to-holder gap 604 being a predetermined function. In this case, the predetermined function is non-uniform in that it varies around the circumference of the wafer 106. In the specific implementation illustrated, the size of the gap 604 is the smallest directly opposite from the pin 602 and largest near the pin 602. Note that if such a pin 602 is used, the presence of the pin 602 itself may affect the electrostatic field near it, so the applied voltage to the ring 304 when the beam is near the pin 602 may need to be adjusted accordingly.

Figure 7:
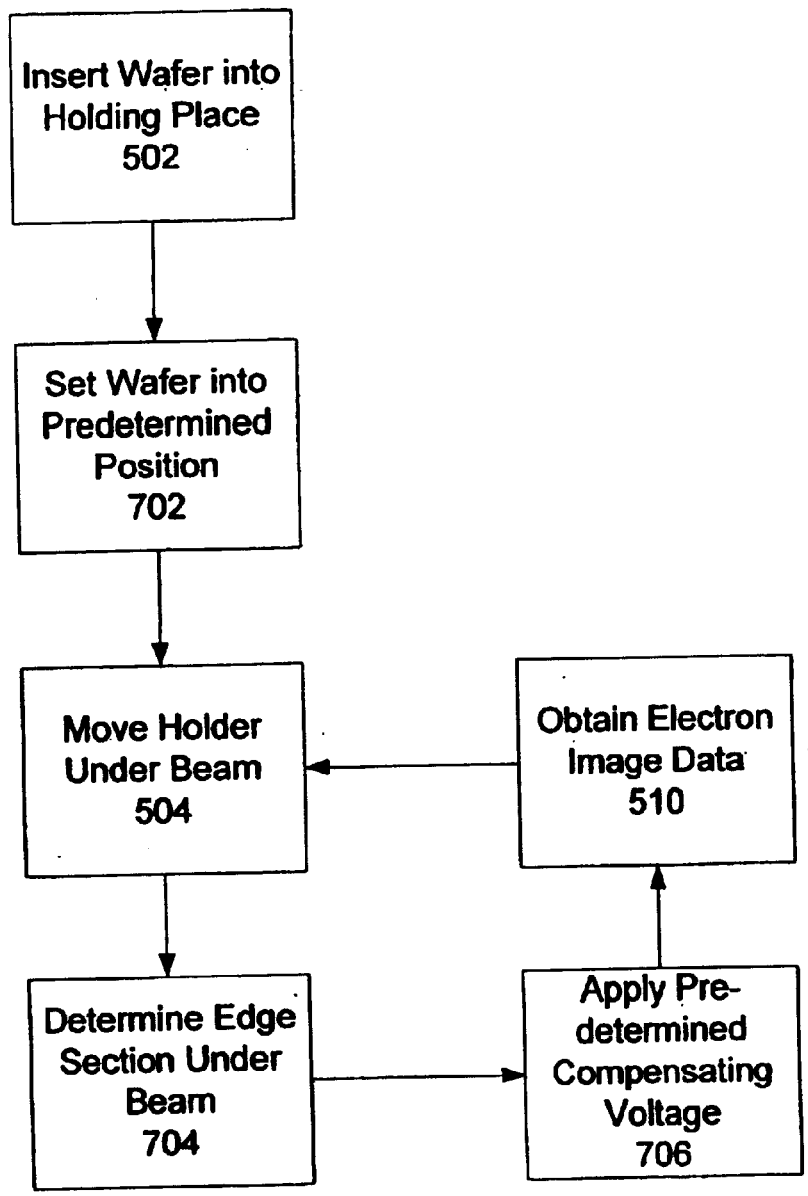
FIG. 7 is a flow chart depicting another method that reduces a wafer edge effect in accordance with an embodiment of the invention.

FIG. 7 is a flow chart depicting another method that reduces a wafer edge effect in accordance with an embodiment of the invention. A wafer 106 is inserted 502 into the holding place 306 within the ring 304. Subsequently, perhaps with several intervening process steps, the wafer 106 is set 504 into a predetermined position within the holding place 306. For example, a pin 602 may be used to set the wafer 106 into a predetermined position as described above in relation to FIG. 6. Since the wafer 106 is in a predetermined position within the holding place 306, the size of the wafer-to-holder gap 604 will be a predetermined function of position on the circumference of the wafer 106.

After the predetermined position is established, the holder 302 with wafer 106 is moved 504 under the e-beam. Of course, when the wafer is under the e-beam for inspection is the time period during which the reduction in edge effect is advantageous to achieve. In accordance with an embodiment of the invention, the e-beam illuminates only a portion of the wafer 106 at a time. As such, only a section of the wafer edge is illuminated at one time. Each section of wafer edge has a corresponding wafer-to-holder gap 404 that is determined by the predetermined function discussed above. Hence, once the particular edge section under the e-beam, a predetermined compensating voltage for the predetermined gap size of that edge section may be applied 706.

Using the predetermined size of the gap 404 under the e-beam, a predetermined compensating voltage may be applied 508 to the ring 304. With the predetermined compensating voltage applied, the electron image data may be obtained 510 without the adverse edge effects due to the distortion in electrostatic field.

Alternatively to the above embodiments, one or more calibration runs under the e-beam may be utilized to determine the proper compensating voltages to apply. Such calibration runs may be disadvantageous in terms of being an additional processing step. However, they may be advantageous in terms of accurately determining the proper compensating voltage in spite of possible changing operating conditions.

In accordance with a preferred embodiment of the invention, the modified holder 302 with wafer 106 may be moved continuously under the e-beam during the wafer inspection. This advantageously speeds up the process of inspection. Such an inspection system may utilize a time delay integrating (TDI) electron detector. The operation of an analogous TDI optical detector is disclosed in U.S. Pat. No. 4,877,326, entitled "Method and Apparatus for Optical Inspection of Substrates," inventors Chadwick et al., and assigned at issuance to KLA Instruments Corporation. The disclosure of U.S. Pat. No. 4,877,326 is hereby incorporated herein by reference. The image information may be processed directly from a 'back thin' TDI electron detector, or the electron beam may be converted into a light beam and detected with an optional optical system and a TDI optical detector. As one alternative to using a TDI electron detector, such an inspection system may utilize a camera type detector.

The above-described diagrams are not necessarily to scale and are intended be illustrative and not limiting to a particular implementation. The above-described invention may be used in an automatic inspection or review system and applied to the inspection or review of wafers, X-ray masks and similar substrates in a production environment. While it is expected that the predominant use of the invention will be for the inspection or review of wafers, optical masks, X-ray masks, electron-beam-proximity masks and stencil masks, the techniques disclosed here may be applicable to the high speed electron beam imaging of other samples.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. A method for inspecting a substrate, the method comprising:

inserting the substrate into a holding place of a substrate holder;

moving the substrate holder under an electron beam; and applying a voltage to a conductive ring configured within said holding place such that the ring is around the inserted substrate, wherein the voltage applied to the conductive ring reduces a substrate edge effect.

2. The method of claim 1, wherein the voltage applied to the conductive ring depends upon a gap size between an edge of the substrate and an edge of the holding place.

3. The method of claim 2, further comprising:
   determining the gap size as the substrate holder moves under the electron beam.
4. The method of claim 1, further comprising:
   setting the substrate into a predetermined position within the holding place.
5. The method of claim 4, wherein the voltage applied to the conductive ring depends on which portion of the substrate holder is currently under the electron beam.
6. The method of claim 1, further comprising: performing a calibration run to determine a voltage function to apply to reduce the substrate edge effect.
7. The method of claim 1, wherein the moving is continuous.
8. The method of claim 7, further comprising: detecting scattered electrons using a time-delayed integrating detector.
9. An apparatus for holding a substrate that reduces a substrate edge effect, the apparatus comprising:
   a holding place for insertion of the substrate; and
   a conductive ring positioned so as to be located within a gap between an edge of the holding place and an edge of the substrate.
10. The apparatus of claim 9, wherein the conductive ring is electrically isolated from the substrate.
11. The apparatus of claim 1, further comprising:
    at least one insulating element supporting the conductive ring.
12. The apparatus of claim 11, further comprising:
    a power supply and conductive mechanism for applying a voltage to the conductive ring.
13. The apparatus of claim 12, wherein the voltage applied is variable and dependent on a size of the gap.
14. The apparatus of claim 9, wherein the apparatus comprises a wafer holder, and wherein the substrate comprises a semiconductor wafer.
15. The apparatus of claim 14, further comprising:
    at least one insulating element supporting the ring.
16. The apparatus of claim 15, further comprising:
    a variable power supply and conductive mechanism for applying a voltage to the ring.
17. A system for inspecting semiconductor wafers, the system comprising:
    a mechanism for moving a wafer holder under an electron beam; and
    means for reducing a wafer edge effect,
    wherein the wafer edge effect depends upon a size of a gap between an edge of the wafer and an edge of the wafer holder and
    wherein said means comprises a conductive ring in said gap between the edge of the wafer and the edge of the wafer holder.
18. The system of claim 17, wherein the means for reducing the wafer edge effect further comprises:
    applying a variable voltage to the conductive ring.

* * * * *